United States Patent [19]

Narasimhan et al.

[11] Patent Number: 5,097,406
[45] Date of Patent: Mar. 17, 1992

[54] LEAD FRAME LEAD LOCATER FOR WIRE BONDER

[75] Inventors: Mandayam A. Narasimhan, Dallas; Virge W. McClure, Richardson; Anthony L. Adams, Wiley, all of Tex.

[73] Assignee: Texas Instruments Incorporated, Dallas, Tex.

[21] Appl. No.: 416,429

[22] Filed: Oct. 3, 1989

[51] Int. Cl.⁵ .............................. G05B 19/18
[52] U.S. Cl. .................. 364/167.01; 228/4.5; 228/105
[58] Field of Search ............... 364/488, 489, 490, 491, 364/167.01, 468; 228/4.5, 8, 102, 103, 105; 358/101; 382/8; 356/400, 401

[56] References Cited

U.S. PATENT DOCUMENTS

| 4,763,827 | 8/1988 | Watanabe et al. | 228/102 |
| 4,851,902 | 7/1989 | Tezuka et al. | 358/101 |
| 4,896,418 | 1/1990 | Yearsley | 29/827 |
| 4,972,311 | 11/1990 | Holdgrafer et al. | 364/167.01 |

Primary Examiner—Jerry Smith
Assistant Examiner—Paul Gordon
Attorney, Agent, or Firm—B. Peter Barndt; Richard Donaldson; William E. Hiller

[57] ABSTRACT

A lead frame locater is used to locate actual positions of lead frame leads in respect to the semiconductor chip to provide accurate wire bonding of the semiconductor chip to the lead frame leads.

17 Claims, 3 Drawing Sheets

LEAD FRAME LEAD LOCATER FOR WIRE BONDER

FIELD OF THE INVENTION

This invention relates to wire bonders, and more particularly to a lead frame lead portion locater station prior to the wire bonder station and a method of locating all the leads on the frame lead.

BACKGROUND OF THE INVENTION

In bonding the bond pads on the semiconductor chip to lead frame fingers in an automatic bonder, it is necessary to first align the semiconductor chip and then bond the lead frame individual lead fingers to the bond pads on the semiconductor chip using a wire bonder.

Prior bonding systems used "Dead Reckoning" or estimation using two points on the lead frame to orientate the lead frame and identify the location of the rest of the lead frame fingers. This system works as long as the lead frame fingers are properly located. Bent or tilted fingers, due to lead frame floatation in glass, and manufacturing variations, displace the lead frame fingers from its normal position. Since bonding to the lead frame finger takes place at the position where the lead frame finger should be if the finger is displaced. This can result in improper connection or no connection at all. This results in a manufacturing blemish and loss of yield.

Systems have been developed that visually display the device and lead frame by video camera at the bonding station. These systems usually use a video cursor two point alignment on the lead frame and chip pad, for example, two corners of the chip. The lead frame fingers are then located using two point data. From the known orientation of the chip and the orientation of the lead frame, the bond pads on the chip are stitch bonded to the lead frame finger. Bent or misaligned lead frame fingers can result in improper bonding of the semiconductor chip to the lead frame fingers.

BRIEF SUMMARY OF THE INVENTION

The present invention utilizes two video cameras. A first camera is used to map the lead frame, mapping all the lead frame fingers, locating each finger relative to a good reference. The mapping system inspects the semiconductor chip on the lead frame and, the lead frame. Software used in the system computes the true lead finger positions relative to a reference point and saves the positions in computer memory. During lead finger mapping, the system computes the variation of the lead fingers from that of the reference and passes the data to a controller that controls the bonder so that the stitch or bond position on the lead fingers can be corrected for out of position fingers.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
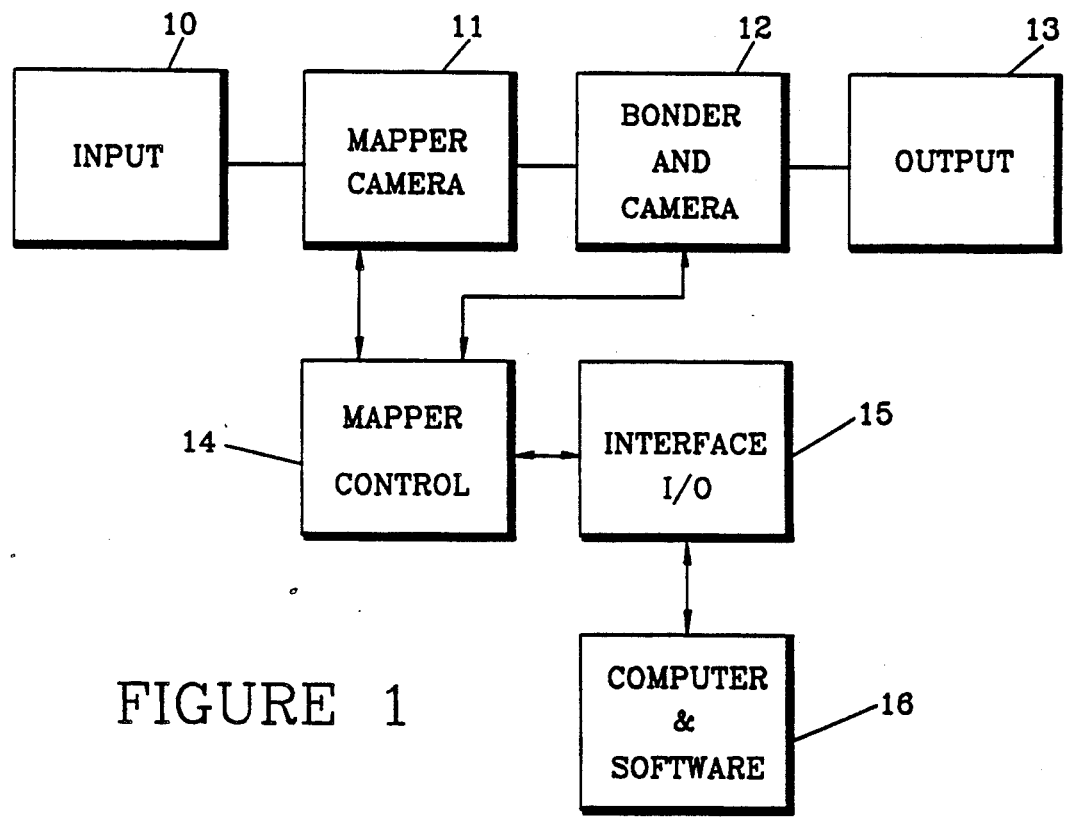
FIG. 1 is a block diagram of a lead frame lead locater and bonder system.

FIG. 1 illustrates a bonding system that includes lead frame lead locating. An input station 10 is used to input the lead frame to the system. The lead frames are transported to a mapper station 11 which includes a camera to focus in on the lead frame and the lead fingers thereon. Through the use of vision algorithms, multiple leads can be located at the same time. All shapes and sizes of leads can be located as well as corners of the lead fingers.

Station 11 maps the location of the lead frame fingers with respect to a semiconductor chip thereon and compares the location of each finger with a reference which is based on an ideal lead frame having lead frame fingers located at specific locations. The mapping information is passed through Mapper Control 14 to computer memory (in computer unit 16) and to Bonder Station 12. A correction factor is input to the Bonder Station 12 as to the corrected stitch position on the lead frame fingers so that proper bonding is made on the lead frame finger actual location.

An Interface I/O 15 interfaces the Mapper Control 14 with a Computer and Software unit 16. The software checks, at Mapper Station 11, for cavity size variations, missing chips or a chip with too much tilt. Then it inspects the chip for defects such as cracks, chipping a dimensional variations. The lead frame is checked for cavity size variations. registration with respect to the chip and ceramic and glass coverage on lead fingers, bent lead fingers and damaged lead frames.

The Bonder Station camera 12 has about twice the magnification of the Mapper Station camera 11 since it is at this station that semiconductor chip alignment is performed, and chip cosmetic defects are examined. Once the semiconductor chip position is found, all lead frame finger positions are updated with reference to the new chip alignment position. As an additional check, the computer verifies to see if the mapped locations of the lead frame leads are within acceptable tolerance or properly bonded, and if not, the lead frame fails, and no bonds are made thereto.

Interface I/O unit 15 may interface with more than one mapper/bonder station so as to use Computer and Software unit 16 with more than one mapper/bonder systems.

Figure 2:
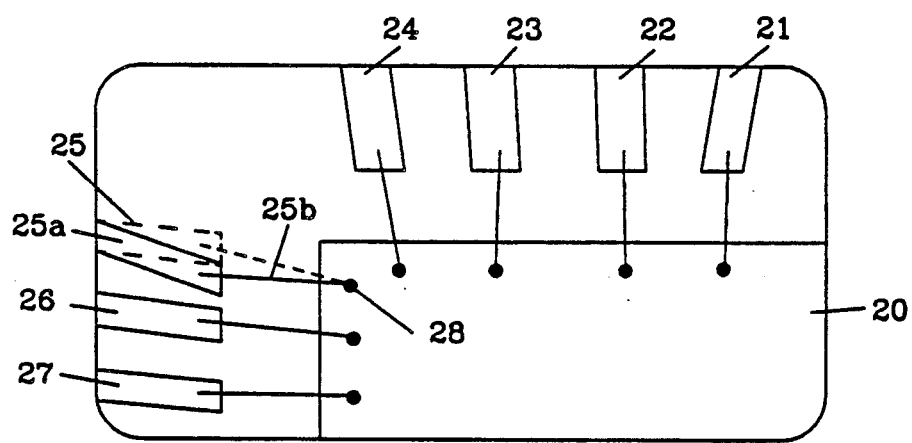
FIG. 2 illustrates wire bonds between a semiconductor chip and lead frame fingers where one lead frame finger is misaligned.

FIG. 2 illustrates a semiconductor chip 20 stitch bonded to lead frame fingers 21 through 27. Lead frame finger 25, shown in dashed lines, is misaligned and the actual position is at 25a.

By mapping the lead frame fingers of the present invention, the wire 25b is bonded to bond pad 28 and lead finger 25a instead of at a position on 25, which does not exist due to the misalignment of lead finger 25.

Figure 3:
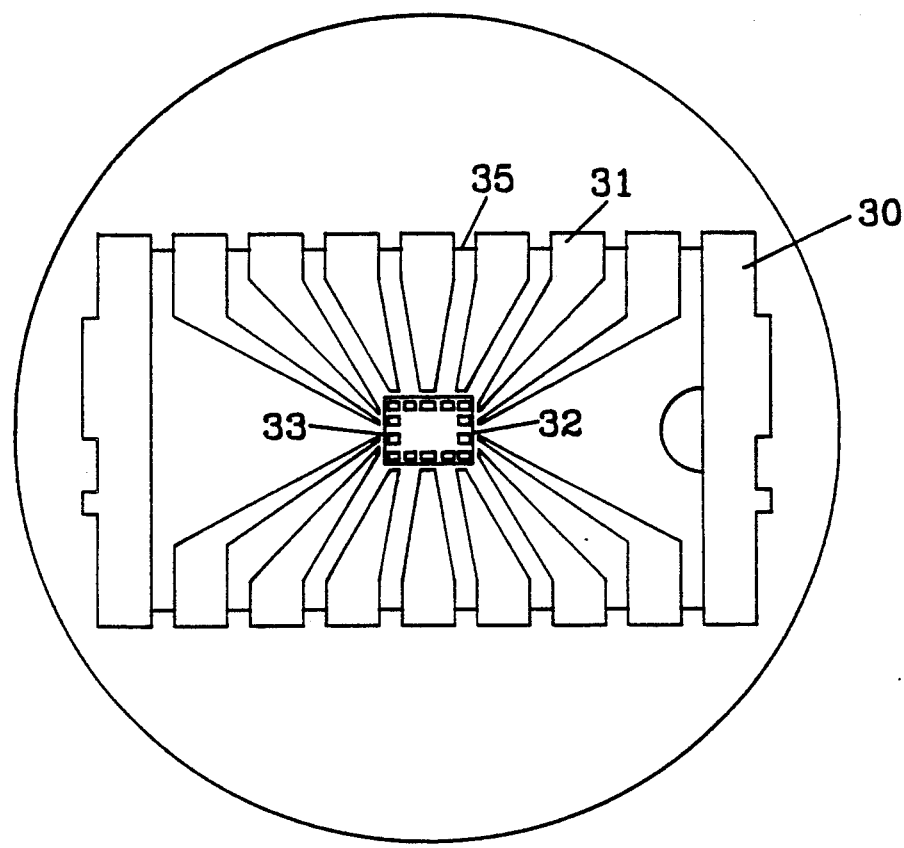
FIG. 3 illustrates a lead frame at the lead frame lead locater station.

FIG. 3 is a view of the lead frame through Mapper Station 11. Lead frame 30 having lead frame fingers 31 are positioned around semiconductor chip 32 having bond pads 33 thereon. The lead frame fingers are held in place by the ceramic or glass base 35 on which it is mounted. When the lead frame is at this position, the lead frame finger position in respect of semiconductor chip position is mapped.

Figure 4:
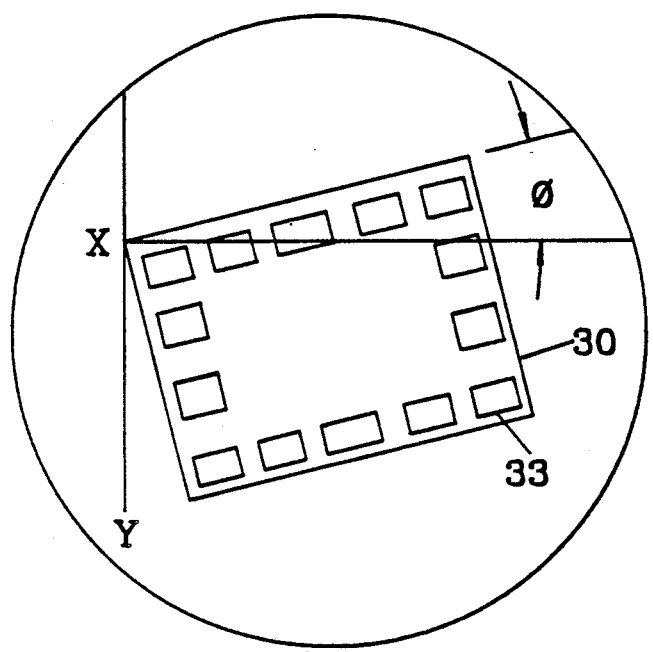
FIG. 4 illustrates semiconductor chip alignment at the bonder station.

FIG. 4 illustrates semiconductor chip alignment at the Bond Station 12. The upper right corner of the semiconductor chip 30 is designated as the O, O position of the X and Y axis. The chip is rotated mathematically through the angle φ to properly align the semiconductor chip. Once the semiconductor chip is aligned, the lead finger mapping data is updated by the computer 16 to present to the Bonder Station 12, the positions of the lead frame leads in respect to the semiconductor chip, and the bond pads thereon.

Figure 5:
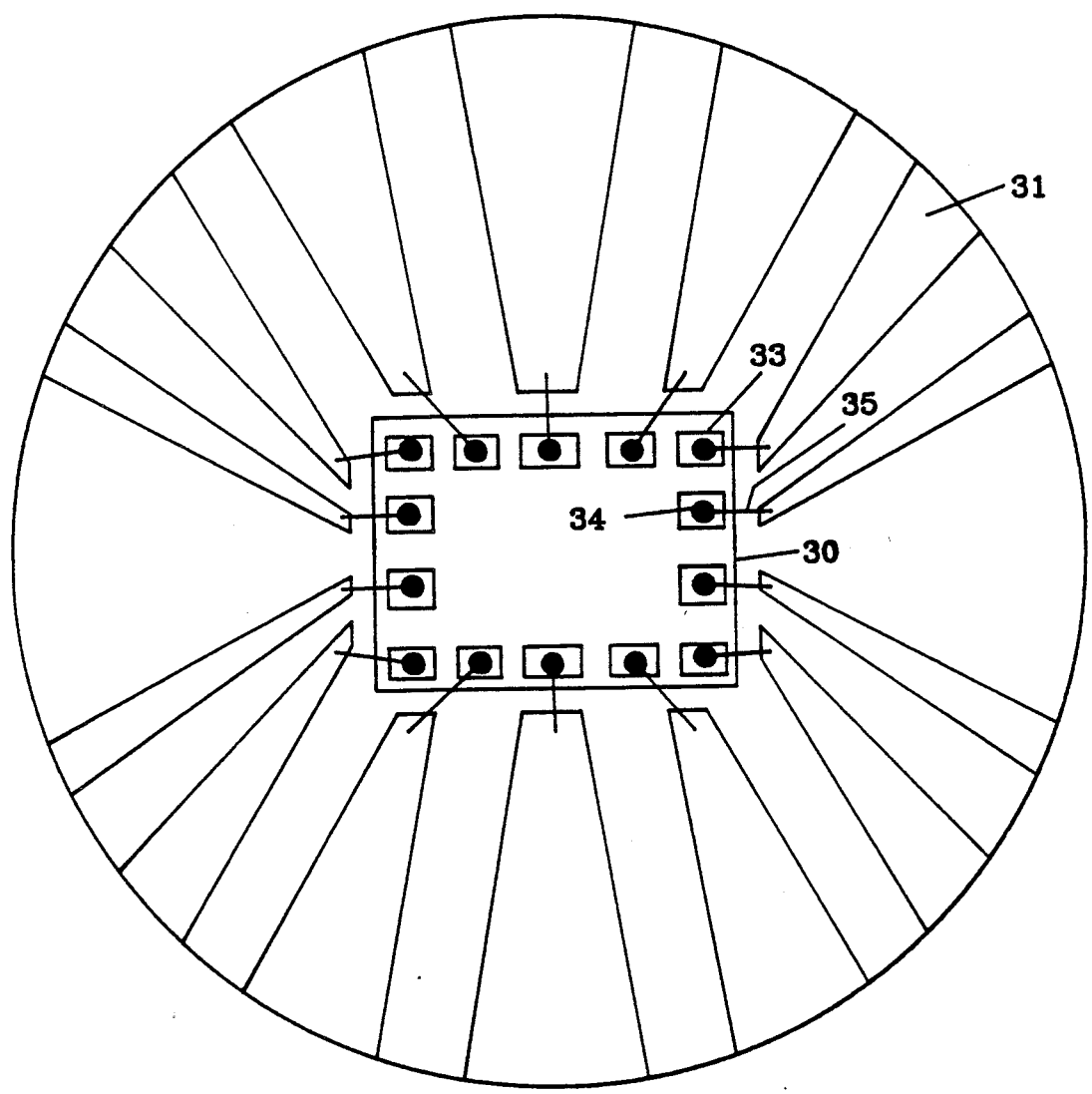
FIG. 5 illustrates wire bond inspection.

FIG. 5 shows the bonded semiconductor chip 30 and ends of the lead frame fingers 31 as viewed at output station 13, FIG. 1. The bonded unit is inspected to ensure that each bond pad 33 on semiconductor chip 30 is attached to a lead frame leads 31 by a bond wire 35. Acceptable units are stored or passed to addition processing stations and rejected units are removed.

What is claimed:

1. A lead finger locating system for use with a semiconductor bonder wherein a semiconductor chip and bond pads thereon are interconnected with lead frame leads by wire bonding, comprising:

a lead frame lead locating station the position of each lead frame lead and defining a reference point on the semiconductor chip;

a bonder station including a semiconductor chip alignment camera and means for mathematically rotating the semiconductor chip through an angle to align the semiconductor chip; and computer controller system for locating the lead finger lead positions with respect to the reference point on semiconductor chip.

2. The lead finger locating system according to claim 1, wherein all the lead frame leads are located with respect to an ideal lead frame.

3. The lead finger locating system according to claim 1, wherein after the semiconductor chip alignment, all lead frame lead positions are updated with reference to the new semiconductor chip alignment position.

4. The lead finger locating system according to claim 1, wherein a correction factor in input to the bonder station to compensate for misaligned lead frame lead locations.

5. The lead finger locating system according to claim 1, including an interface circuit to interface the lead frame locating station and the bonder station with the computer controller.

6. The lead finger locating system according to claim 1, wherein multiple lead fingers are located simultaneously.

7. A lead finger locating system for use with a semiconductor bonder wherein a semiconductor chip and bond pads thereon are interconnected with lead frame leads by wire bonding, comprising:

a lead frame lead locating station including a camera for locating the position of each lead frame lead;

a bonder station including a semiconductor chip alignment camera and means for mathematicaly rotating the semiconductor chip through an angle to align the semiconductor chip;

computer controller system for locating the lead finger lead positions with respect to the aligned semiconductor chip; and an interface circuit for interfacing the lead frame locating station, the bonder station and the computer controller.

8. The lead finger locating system according to claim 7, wherein the lead frame leads are located with respect to an ideal lead frame.

9. The lead finger locating system according to claim 7, wherein after the semiconductor chip alignment, all lead frame lead positions are updated with reference to the new semiconductor chip alignment position.

10. The lead finger locating system according to claim 7, wherein a correction factor is input to the bonder station to compensate for misaligned lead frame lead locations.

11. A method for locating lead finger positions for use with a semiconductor bonder, wherein a semiconductor chip and bond pads thereon are interconnected with lead frame leads by wire bonding, comprising the steps of:

defining a reference point on a semiconductor chip;
locating the lead frame leads with respect to the semiconductor chip reference point;
mathematically aligning the semiconductor chip; and
relocating the lead frame leads with respect to the aligned semiconductor chip.

12. The method according to claim 11, wherein the lead frame leads are located with respect to an ideal lead frame reference.

13. The method according to claim 11, including the step of updating the lead frame lead locations with respect to the aligned semiconductor chip.

14. The method according to claim 11 including the step of inputting a correction factor input to the bonder station to compensate for misaligned lead frame lead locations.

15. The method according to claim 11, including an interface circuit to interface the lead frame locating station and the bonder station with the computer controller.

16. The method according to claim 11, including the step of locating multiple lead fingers simultaneously.

17. A lead finger locating system for use with a semiconductor bonder wherein a semiconductor chip and bond pads thereon are interconnected with lead frame leads by wire bonding, comprising:

a lead frame lead locating station including a camera for locating the position of each lead frame lead;

a bonder station including a semiconductor chip alignment camera;

means for mathematically rotating the semiconductor chip through an angle to align the semiconductor chip;

computer controller system for locating the lead finger lead positions with respect to the aligned semiconductor chip; and an interface circuit for interfacing one or more lead frame locating stations and the bonder stations with the computer controller.

* * * * *